(12) United States Patent
Cai

(10) Patent No.: US 6,396,360 B1
(45) Date of Patent: May 28, 2002

(54) METHOD AND CIRCUITRY FOR IMPLEMENTING AN INDUCTOR-CAPACITOR PHASE INTERPOLATED VOLTAGE-CONTROLLED OSCILLATOR

(75) Inventor: Yijun Cai, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/788,220

(22) Filed: Feb. 16, 2001

Related U.S. Application Data
(60) Provisional application No. 60/182,756, filed on Feb. 16, 2000.

(51) Int. Cl.[7] .............................. H03B 5/02; H03B 5/00
(52) U.S. Cl. ................... 331/108 B; 331/135; 331/136; 331/177 R
(58) Field of Search ............................... 331/34, 108 B, 331/135–137, 177 R

(56) References Cited

U.S. PATENT DOCUMENTS 4,884,041 A 11/1989 Walker
5,912,596 A * 6/1999 Ghoshal ................. 331/117 R

* cited by examiner

*Primary Examiner*—David Mis
(74) *Attorney, Agent, or Firm*—Townsend and Townsend and Crew LLP

(57) ABSTRACT

Method and circuitry for implementing an inductor-capacitor voltage-controlled oscillator with improved overall performance. In an exemplary embodiment, the present invention includes two phase shifters and an interpolator. The two phase shifters are coupled to the interpolator in a loop configuration. That is, output from the two phase shifters are fed into the interpolator. The output of the interpolator, in turn, is fed back to the two phase shifters. The two phase shifters and the interpolator respectively utilize LC tanks having different fixed resonant frequencies, with the first phase shifter resonant frequency being the lowest, the interpolator resonant frequency being in the middle and the second phase shifter resonant frequency being the highest. Signals from the first and second phase shifters are selectively combined by the interpolator according to a control signal. Thus, the VCO can be continuously tuned near the resonant frequency of the interpolator.

19 Claims, 5 Drawing Sheets

METHOD AND CIRCUITRY FOR IMPLEMENTING AN INDUCTOR-CAPACITOR PHASE INTERPOLATED VOLTAGE-CONTROLLED OSCILLATOR

CROSS-REFERENCES TO RELATED APPLICATIONS

The present application claims the benefit of priority under 35 U.S.C. § 119 from the provisional patent application, U.S. patent application Ser. No. 60/182,756, filed on Feb. 16, 2000, which is hereby incorporated by reference as if set forth in full in this document.

BACKGROUND OF THE INVENTION

Voltage-controlled oscillators (VCOs) are commonly used in communication systems where accurate control of frequency or phase of a given signal is desirable. Various types of oscillating circuits such as relaxation oscillators, ring oscillators and inductor-capacitor (LC) oscillators have been used to implement VCOs.

The VCO performance may be affected by its tuning mechanism. VCO tuning based on interpolating two different RC delay paths has shown better performance compared with conventional current starving type ring oscillator.

For example, in a prior art RC delay interpolating ring oscillator, such as that described in U.S. Pat. No. 4,884,041 by Walker, two paths with different number of delay cells are used in combination with a linear combining circuit to provide a ring oscillator capable of varying oscillation frequency within a certain specified range. However, due to the lack of high-Q elements in the delay cells, this particular ring oscillator, does not provide good noise performance. In addition, due to the process limitation of the delay cells, the operating frequency of the oscillation signal is limited.

For very high frequency applications, LC VCOs have been favored because of their improved frequency stability and superior phase noise performance. The most common LC VCO is tuned by a diode varactor. Varactors, however, suffer from a number of shortcomings including, for example, process dependent, bias dependent and nonlinearity problems.

More importantly, the operating frequency of an LC VCO is controlled by the resonant frequency of the LC tank, which is given by $f=1/(2\pi\sqrt{LC})$. According to this equation, in order to increase the resonant frequency, either inductance L and/or capacitance C need to be reduced. When the inductance L is reduced, the impedance of the LC tank will accordingly decrease. As a result, more power is required for the VCO to maintain oscillation. The need for additional power, however, leads to use of larger transistors which introduce more parasitic capacitance. The increase in parasitic capacitance contributes to the total capacitance and thus decreases the resonant frequency.

Furthermore, varactors constitute a major portion of the total capacitance. The use of varactors is contrary to the goal of reducing the total capacitance in order to increase resonant frequency. Moreover, the tuning range and driving capability requirements of varactors often limit the reduction of the total capacitance. It is, therefore, desirable to provide an LC VCO which is implemented without using varactors.

SUMMARY OF THE INVENTION

The present invention provides methods and circuitry for implementing inductor-capacitor phase interpolated voltage-controlled oscillators using standard CMOS process technology.

In an exemplary embodiment, the present invention includes two phase shifters and an interpolator. The two phase shifters are coupled to the interpolator in a loop configuration. The differential output from the two phase shifters are fed into the interpolator. The differential output of the interpolator, in turn, is fed back to the two phase shifters.

The two phase shifters and the interpolator respectively utilize LC tanks as tuned circuits. The respective resonant frequencies of the LC tanks of the two phase shifters are different but close to each other. The resonant frequency of the interpolator is at the center of the VCO tuning range. The resonant frequency of one phase shifter is higher than that of the interpolator; while the resonant frequency of the other phase shifter is lower. The interpolator control is operated in the linear region and the signal gain from the two phase shifters may be continuously tuned when signals from the two phase shifters are combined at the interpolator. Both VCO and VCO control operate in a fully differential manner.

In an exemplary embodiment, the present invention provides a voltage-controlled oscillator including: a first phase shifter and a second phase shifter each having an inductor-capacitor resonator circuit, wherein the respective resonant frequencies of the first and second phase shifters are different, and an interpolator having an inductor-capacitor resonator circuit, wherein the resonant frequency of the resonator circuit of the interpolator is set between the respective resonant frequencies of the first and second phase shifters.

The two phase shifters utilize CMOS differential-pair as a tuned buffer, which has a pair of high frequency input and a pair of high-frequency output. The interpolator utilizes a multiplexor configuration, which has two pairs of high-frequency input and a pair of high-frequency output, as well as a pair of low-frequency control signals. All the high frequency signals and low-frequency control signals operate in a fully differential manner. The output from the two phase shifters are fed into the high frequency input of the interpolator. The output of the interpolator, in turn, is fed back to the inputs of two phase shifters. Signals from the first and second phase shifters are selectively combined by the interpolator according to the control signal. Thus, the VCO can be continuously tuned near the resonant frequency of the interpolator.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings. In the drawings, like reference numbers indicate identical or functionally similar elements.

DESCRIPTION OF THE SPECIFIC EMBODIMENTS

Figure 1:
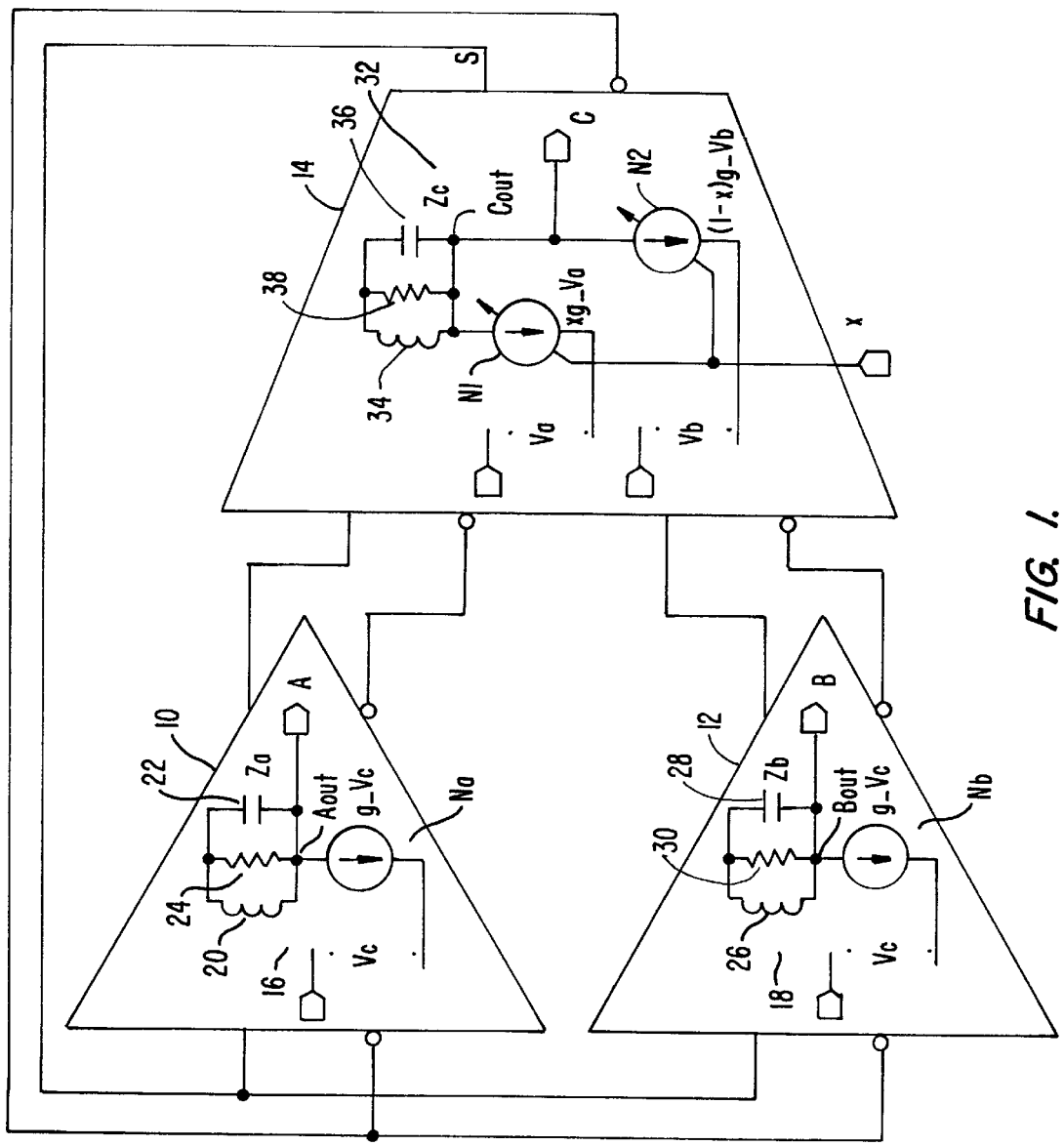
FIG. 1 is a simplified block diagram showing an exemplary embodiment of the present invention.

The present invention will now be described in detail. FIG. 1 shows a simplified block diagram of an exemplary embodiment of the present invention. As shown in FIG. 1, the exemplary embodiment includes a first phase shifter 10, a second phase shifter 12, and an interpolator 14. The phase shifters 10, 12 and the interpolator 14 are connected in a loop configuration.

More specifically, the respective output of the first and second phase shifters 10, 12 are connected to the input of the interpolator 14. The output of the interpolator 14, in turn, is connected to the respective input of the phase shifters 10, 12. Hence, the interpolator 14 and the phase shifters 10, 12 are arranged in a loop configuration that provides a feedback mechanism. It is to be understood that the circuit implementations depicted herein are for illustrative purposes only, and that other modifications are possible.

In the exemplary embodiment, as shown in FIG. 1, the first phase shifter 10 having a small-signal differential-half-circuits of buffer diff-pair is shown. More specifically, the half-circuit diff-pair includes an LC tank 16 or resonator circuit and an n-type transistor Na. The n-type transistor Na is depicted in a small-signal representation. The LC tank 16 typically includes an inductor 20, a capacitor 22, and a resistor 24. The inductor 20, the capacitor 22 and the resistor 24 are connected in parallel forming a node which is connected to the drain of the n-type transistor Na. The input is at the gate of the diff-pair and the output is at the drain of the diff-pair.

Likewise, as shown in FIG. 1, the second phase shifter 14 also includes a half-circuit diff-pair having an LC tank 18 or resonator circuit and a n-type transistor Nb (which is similarly depicted in a small-signal representation). The LC tank 18 typically includes an inductor 26, a capacitor 28 and a resistor 30 connected in parallel forming a node which is connected to the drain of the n-type transistor Nb. The input is at the gate of the diff-pair and the output is at the drain of the diff-pair.

Figure 2:
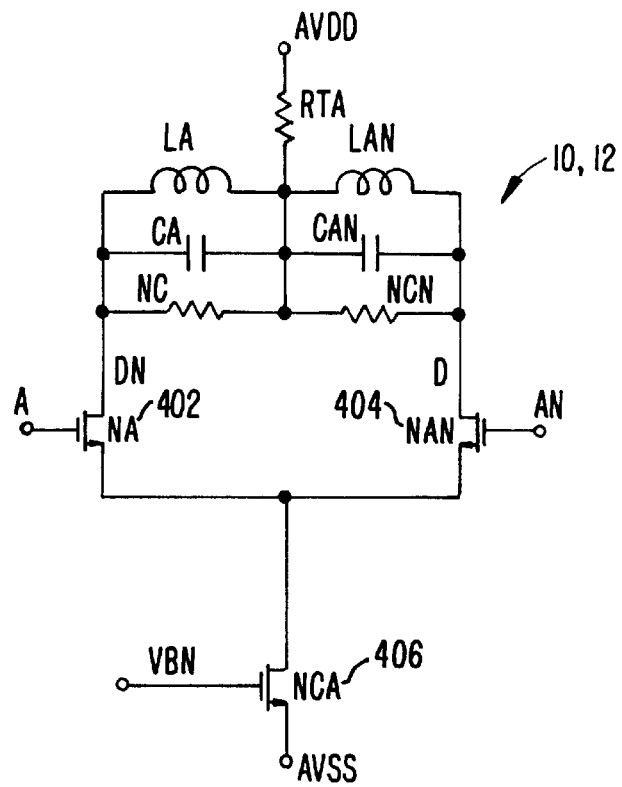
FIG. 2 is a simplified circuit diagram showing one implementation of a phase shifter in accordance with the present invention.

FIG. 2 shows an exemplary circuit implementation for the phase shifters 10, 12 in CMOS. Each phase shifter 10, 12, in this embodiment, is implemented using a differential pair of n-channel input transistors 402 and 404 with their common source node coupled to a current-source transistor 406. A pair of LC tanks provide the load devices. The resistor RTA and tail current source transistor provide necessary isolation to power supply AVDD and AVSS.

The transfer function of the phase shifter 10, 12 is determined by the impedance of the LC tanks. The phase and magnitude of the output signal of the phase shifters 10, 12 are shown in FIGS. 3 and 4, respectively.

Figure 3:
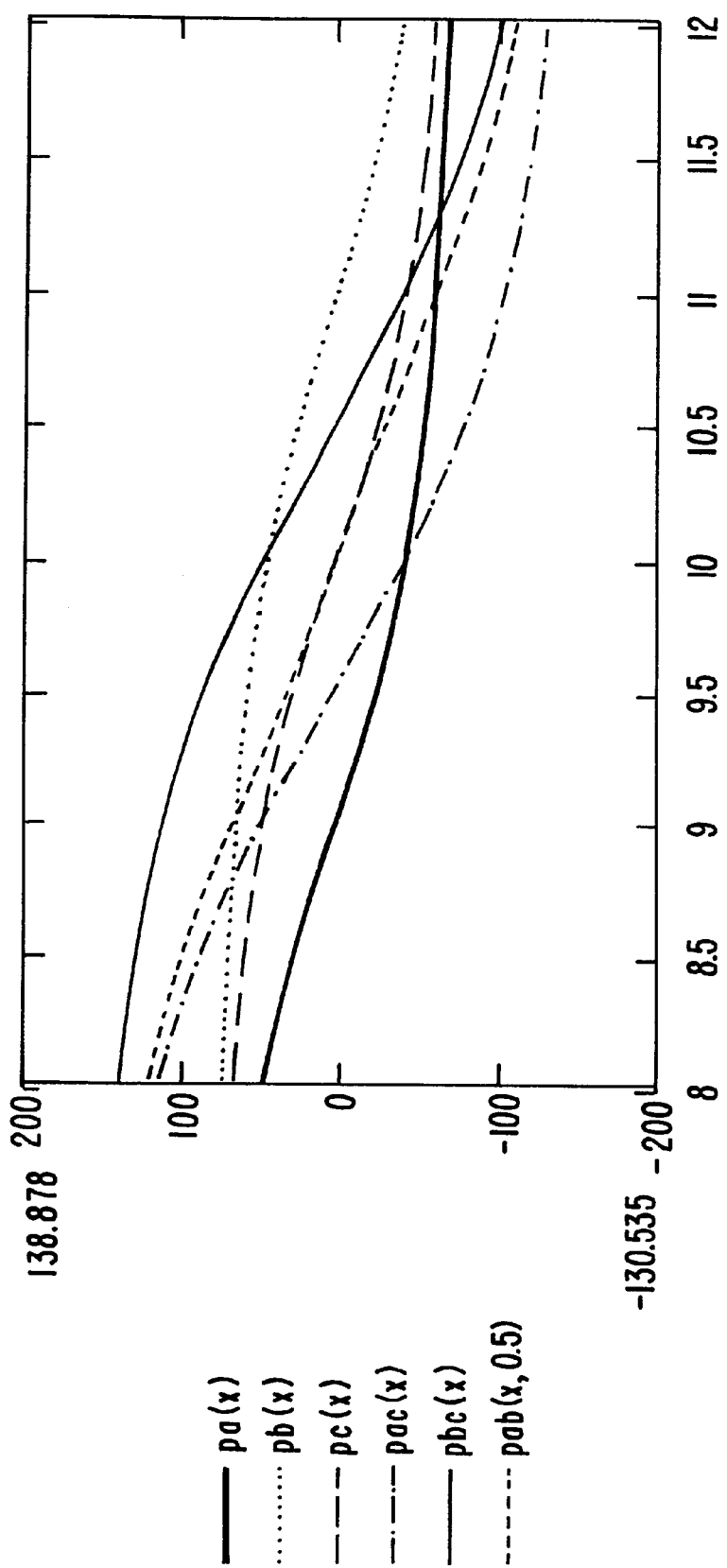
FIG. 3 is a diagram showing the phase vs. frequency of the LC tanks in accordance with the present invention.

As shown in FIG. 3, Pa(x) is the phase of the first phase shifter 10, Pb(x) is the phase of the second phase shifter 12, and Pc(x) is the phase of the interpolator 14. Pac(x) is the phase of the signal going through both the first phase shifter 10 and the interpolator 14. Pbc(x) is the phase of a signal going through both the second phase shifter 12 and the interpolator 14. Pab(x,0.5) is the phase of a signal going through both phase shifters 10 and 12 and then combined at the interpolator 14 with equal strength.

Figure 4:
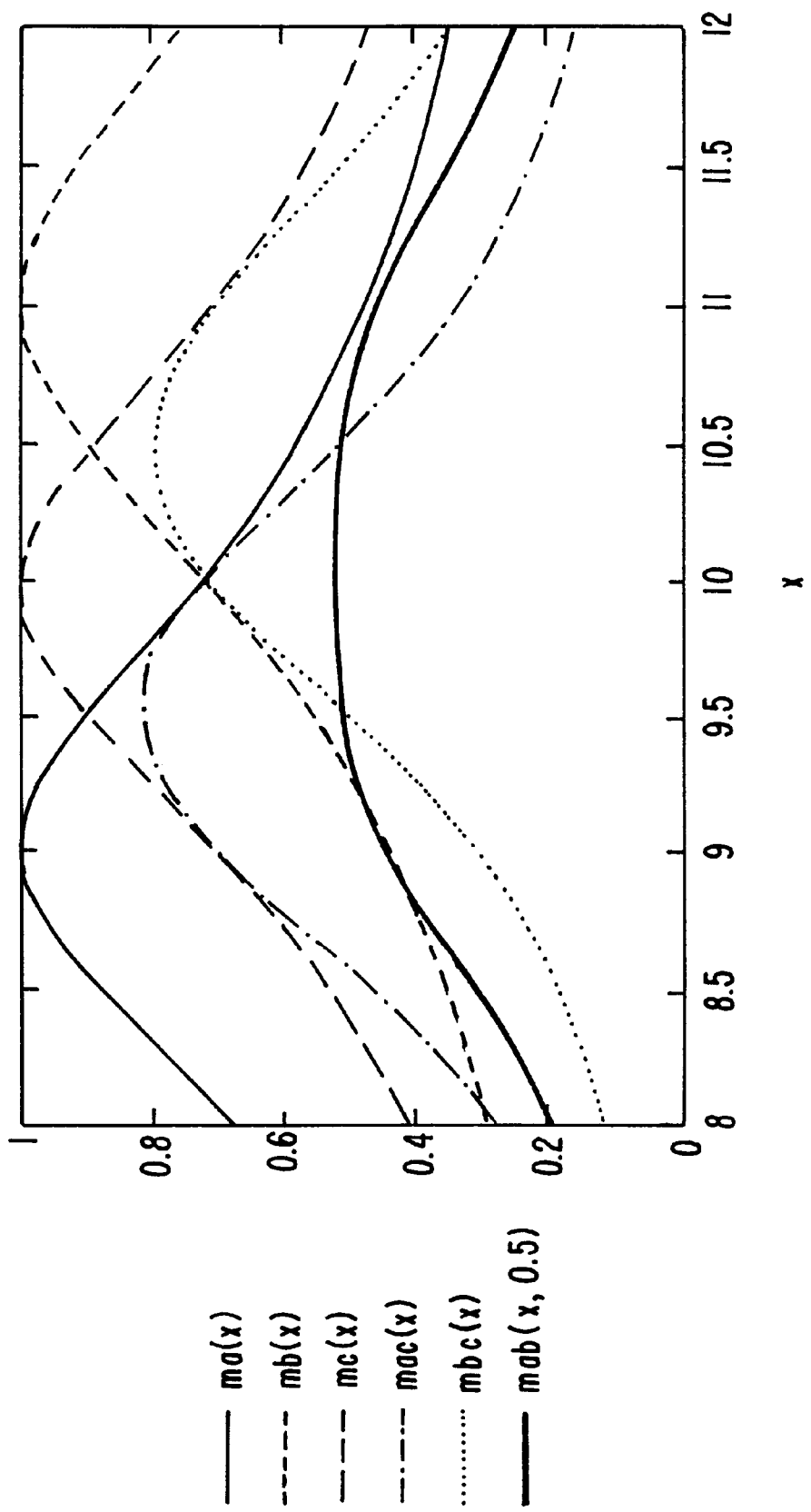
FIG. 4 is a diagram showing the magnitude of the output signal of the LC tanks in accordance with the present invention.

As shown in FIG. 4, ma(x) is the magnitude of the first phase shifter 10, mb(x) is the magnitude of the second phase shifter 12, and mc(x) is the magnitude of the interpolator 14. mac(x) is the magnitude of a signal going through both the first phase shifter 10 and the interpolator 14. mbc(x) is the magnitude of a signal going through both the second phase shifter 12 and the interpolator 14. mab(x,0.5) is the magnitude of a signal going though both phase shifters 10 and 12 and then combined at the interpolator 14 with equal strength.

Referring back to FIG. 1, the interpolator 14 includes a multiplexor (mux) shown in small-signal differential-half-circuits diff pairs along with the LC tank 32 or resonator circuit loading. The transfer characteristic of the interpolator 14 is determined by the impedance of the LC tank 32. Parallel RLC circuits are used to represent the actual inductor including parasitic from transistor, interconnect and substrate.

More specifically, the interpolator 14 includes an LC tank 32, a first n-type transistor N1, and a second n-type transistor N2. The n-type transistors N1 and N2 are depicted in a small-signal representation. The LC tank 32 includes an inductor 34, a capacitor 36 and a resistor 38. The inductor 34, the capacitor 36 and the resistor 38 are connected in parallel forming a node which is connected to the drain of transistors N1 and N2. The output of the phase shifters 10, 12 are connected to the respective gate of transistors N1 and N2.

Figure 5:
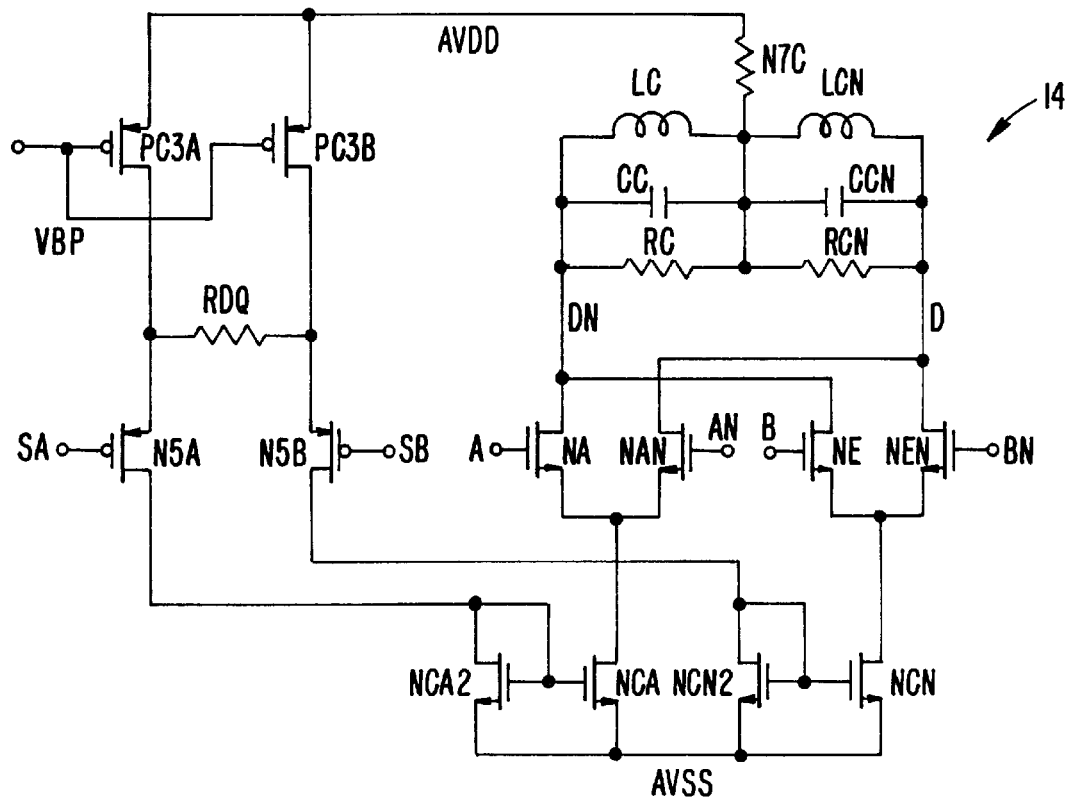
FIG. 5 is a simplified circuit diagram showing one implementation of an interpolator in accordance with the present invention.

FIG. 5 is a simplified circuit diagram showing one implementation of the interpolator 14 in accordance with the present invention. In this embodiment, the interpolator 14 is implemented using CMOS technology. As shown in FIG. 5, the drain of the two input diff-pairs (positive side and/or negative side) are coupled together, and loaded by a pair of LC tanks. The tail currents of each diff-pair are tunable. This is similar to a CML multiplexor operating linearly.

The control signal of interpolator 14, as shown in FIG. 5, has a folded architecture which allows for operating under low power supply voltage, and therefore reducing the required minimum voltage headroom. Control signals SA and SB are applied to the folded differential input pair of transistors. Degeneration resistor can be used to increase the tuning linearity.

The operation of the exemplary embodiment, as shown in FIG. 1, is described as follows. The LC tanks 16, 18 and 32 used in the phase shifters 10, 12 and the interpolator 14, respectively, each produces a fixed resonant frequency. The respective fixed resonant frequencies for the phase shifters 10, 12 and the interpolator 14 are produced using capacitors 22, 28, and 36 having a fixed capacitance. In other words, the capacitors 22, 28 and 36 can each be selected with a different fixed capacitance. By using capacitors with a fixed capacitance, the problems associated with varactors are minimized.

Typically, for a phase shifter, when the input frequency is smaller than the resonant frequency, the input signal undergoes a positive phase shift. On the other hand, when the input frequency is larger than the resonant frequency, the input signal undergoes a negative phase shift. Finally, when the input frequency is equal to the resonant frequency, the input signal does not undergo any phase shift at all.

As FIG. 1 shows, the same differential input signal is fed into the phase shifters 10 and 12. Hence, since the phase shifters 10 and 12 have different resonant frequencies, the output signals generated by the phase shifters 10 and 12 have different phases. The output signals are then fed into the interpolator 14.

The interpolator 14 then, subject to an external control signal, selectively combines the two output signals from the phase shifters 10 and 12. Since the interpolator 14 has its own LC tank 32, the output of the interpolator 14 may then be phase-shifted. If the strengths of the two output signals from the phase shifters 10 and 12 are the same (after adjustment by the external control signal), then the combined signal is passed by the interpolator 14 without any phase shift. In the event that there is a differential between the strengths of the two adjusted output signals from the phase shifters 10 and 12, the combined signal is phase-shifted by the interpolator 14 relative to the resonant frequency of the interpolator 14.

The resonant frequency fc for the interpolator 14 is selected to be at the center of the VCO tuning range. The resonant frequency fa of the first phase shifter 10 is selected to be lower than fc and the resonant frequency fb of the second phase shifter 12 is selected to be higher than fc. Typically, the separation between fa and fib are selected based on the quality factor Q of the LC tanks 16 and 18.

Figure 6:
FIG. 6 is a simplified phase diagram showing the phase shifts of various LC tanks in accordance with an exemplary embodiment of the present invention.

FIG. 6 is a simplified phase diagram illustrating the phase of LC tanks 16, 18 and 32. As shown in FIG. 6, the phase of each LC tank 16, 18 and 32 assumes a similar curve. As mentioned above, the resonant frequency of an LC tank behaves in accordance with the equation $f=1/(2\pi\sqrt{LC})$. Hence, depending on the chosen fixed capacitance and inductance, each LC tank 16, 18 and 32 may exhibit a different resonant frequency.

As FIG. 6 shows, LC tank 16 has the lowest resonant frequency fa among the three LC tanks 16, 18 and 32, LC tank 32 has the second lowest resonant frequency fc, and LC tank 18 has the highest resonant frequency fib. Due to the different constitution of the LC tanks 16, 18 and 32, the respective frequencies of the output signals for the phase shifters 10 and 12 and the interpolator 14 are the same, but their respective phases are different.

Let Aout, Bout and Cout represent the respective transfer functions of the phase shifters 10 and 12 and the interpolator 14 and x represents a control signal as shown in FIG. 1. The output S of the interpolator 14 behaves according to the following equation:

$$S=(1-x)\text{Aout Cout}+x\text{Bout Cout} \qquad \text{Eq. 1}$$

This equation Eq. 1 is derived based on the circuit configuration shown in FIG. 1. It is well known in circuit theory that output from cascading elements is calculated by multiplying all the individual elements and that output from elements sharing a common node is calculated by adding all the individual elements.

Generally, as shown in FIG. 1, the LC tank 16 from the phase shifter 10 is cascaded with the LC tank 32 from the interpolator 14 thereby resulting in a signal represented by the product Aout Cout. Similarly, the LC tank 18 from the phase shifter 12 is cascaded with the LC tank 32 from the interpolator 14 thereby resulting in a signal represented by the product Bout Cout. Since the output signals from the two phase shifters 10 and 12 are tied or combined together, the products Aout Cout and Bout Cout are added. In the equation Eq. 1, x is the control signal having a value ranging between 0 and 1. The control signal x is used to weigh the products Aout Cout and Bout Cout accordingly.

The current going through transistor N1 is controlled by the equation $xg_m Va$, where x is the control signal, $g_m$ is the transconductance, and Va is the output signal voltage from the first phase shifter 10. Likewise, the current going through transistor N2 is controlled by the equation $(1-x)$ $g_m Vb$, where Vb is the output signal voltage from the second phase shifter 12. Methods and ways to control current sources such as using current mirrors are commonly known in the art.

The requisite conditions for oscillation are as follows. The overall loop gain has to be larger than one and the overall phase shift has to be zero (or 360 degree). The overall open loop gain is determined by the product of the magnitude of S and the gm of input transistor. The frequency which results in zero phase of S can be found according to Eq. 1.

Figure 7A:
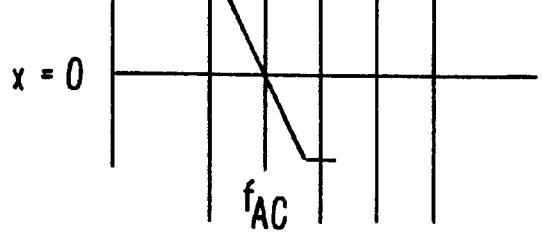
FIGS. 7a–7c are simplified phase diagrams illustrating the operation of the second exemplary embodiment of the present invention.
Figure 7B:
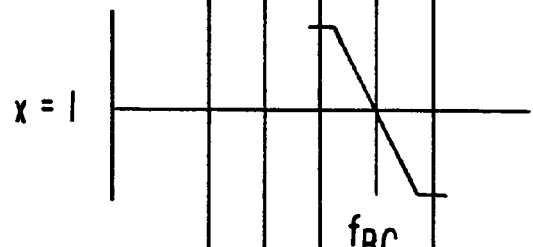
Figure 7C:
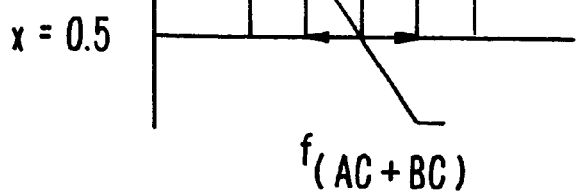

FIGS. 7a–7c illustrate how the control signal x affects the phase shift of the output S of the interpolator 14. Referring to FIG. 7a, the control signal is given a value of 0. When x is equal to 0, the product x Bout Cout also becomes 0. In other words, input from phase shifter 12 is ignored. As a result, the output S of the interpolator 14 is represented by the product Aout Cout. Graphically, as shown in FIG. 7a, the frequency fac has zero phase shift, so the VCO will oscillate at fac. fac represents the lower bound of the tuning range.

Referring to FIG. 7b, the control signal x is given a value of 1. When x is equal to 1, the product (1–x) Aout Cout becomes 0. In this case, input from phase shifter 10 is ignored. Hence, the output S of the interpolator 14 is represented by the product Bout Cout. Graphically, as shown in FIG. 7b, the frequency fbc has zero phase shift, so the VCO will oscillate at fbc. fbc represents the upper bound of the tuning range.

Referring to FIG. 7c, the control signal x is given a value of 0.5. When x is equal to 0.5, the output S of the interpolator 14 is represented by the sum of the products Aout Cout and Bout Cout. The frequency fc has zero phase shift, so the VCO will oscillate at fc the center of the tuning.

From FIGS. 7a–7c, it is seen that by changing the value of x between the range 0 and 1, the VCO frequency can be tuned from fac to fbc. Due to the multiplicative effect of AoutCout or BoutCout, the combined phase vs. frequency curve slope is made steeper when compared with the slope of a single LC tank.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A voltage-controlled oscillator comprising:
    a first phase shifter and a second phase shifter each having an inductor-capacitor resonator circuit, wherein the respective resonant frequencies of said first and second phase shifters are different; and
    an interpolator having an inductor-capacitor resonator circuit, wherein the resonant frequency of said interpolator is set between the respective resonant frequencies of said first and second phase shifters;
    wherein, signals generated by said first and second phase shifters are selectively combined by said interpolator using a control signal.

2. The voltage-controlled oscillator according to claim 1, wherein said first and second phase shifters and said interpolators are arranged in a loop configuration.

3. The voltage-controlled oscillator according to claim 1, wherein said inductor-capacitor resonator circuit of said interpolator has a fixed capacitance and said respective inductor-capacitor resonator circuits of said first and second phase shifters have fixed capacitance; and wherein the fixed capacitance of said inductor-capacitor resonator circuit of said interpolator is different from the fixed capacitance of said inductor-capacitor resonator circuit of said first and second phase shifters.

4. The voltage-controlled oscillator according to claim 1, wherein said first and second phase shifters and said interpolator are implemented using CMOS technology.

5. The voltage-controlled oscillator according to claim 1, wherein the respective resonant frequencies of said first and second phase shifters and said interpolator are fixed.

6. A voltage-controlled oscillator comprising:
a first phase shifter;
a second phase shifter; and
an interpolator;
wherein said first phase shifter, said second phase shifter and said interpolator are coupled together in a loop configuration; and
wherein said first phase shifter, said second phase shifter and said interpolator each includes an inductor-capacitor tank having a fixed resonant frequency.

7. The voltage-controlled oscillator according to claim 6, wherein said inductor-capacitor tank of said first phase shifter is configured to generate a first signal;
wherein said inductor-capacitor tank of said second phase shifter is configured to generate a second signal;
wherein said inductor-capacitor tank of said interpolator is configured to generate a third signal; and
wherein said third signal is selectively combined with said first and second signals to generate an output.

8. The voltage-controlled oscillator according to claim 6, wherein said first and second phase shifters and said interpolator are implemented using CMOS technology.

9. A voltage-controlled oscillator comprising:
a first phase-shifting circuit configured to generate a first signal by using a first inductor-capacitor tank having a fixed capacitance;
a second phase-shifting circuit configured to generate a second signal by using a second inductor-capacitor tank having a fixed capacitance; and
an interpolation circuit configured to generate a third signal by using a third inductor-capacitor tank having a fixed capacitance and selectively combine said third signal with said first and second signals to generate an output.

10. The voltage-controlled oscillator according to claim 9, wherein said first and second phase-shifting circuits and said interpolation circuit are implemented using CMOS technology.

11. A voltage-controlled oscillator comprising:
a first phase shifter having an input and an output;
a second phase shifter having an input and an output; and
an interpolator having an input and an output;
wherein said respective output of said first and second phase shifters is coupled to said input of said interpolator;
wherein said output of said interpolator is coupled to said respective input of said first and second phase shifters;
wherein said first phase shifter, said second phase shifter and said interpolator each includes an inductor-capacitor tank having a fixed capacitance; and
wherein said interpolator selectively controls said respective output of said first and second phase shifters to generate a signal with an improved resonant frequency.

12. The voltage-controlled oscillator according to claim 11, wherein the respective fixed capacitance of said inductor-capacitor tank of said first and second phase shifters and said interpolator are different.

13. The voltage-controlled oscillator according to claim 12, wherein the fixed capacitance of said inductor-capacitor tank of said first phase shifter is lower than the fixed capacitance of said inductor-capacitor tank of said interpolator; and
wherein the fixed capacitance of said inductor-capacitor tank of said second phase shifter is higher than the fixed capacitance of said inductor-capacitor tank of said interpolator.

14. The voltage-controlled oscillator according to claim 11, wherein said signal is generated by selectively combining said respective output of said first and second phase shifters with an output of said inductor-capacitor tank of said interpolator.

15. An inductor-capacitor phase interpolated voltage-controlled oscillator comprising:
a first phase shifter having a first inductor-capacitor tank with a fixed capacitance;
a second phase shifter having a second inductor-capacitor tank with a fixed capacitance; and
an interpolator having a third inductor-capacitor tank with a fixed capacitance, a first and a second transistor coupled to said third inductor-capacitor tank;
wherein respective output of said first and second phase shifters are coupled to said first and second transistors;
wherein an output of said interpolator is coupled to respective input of said first and second phase shifters;
wherein respective output from said first, second and third inductor-capacitor tanks are combined to generate a signal representing an output of said oscillator; and
wherein said first and second transistors are used to selectively manipulate said respective output of said first and second phase shifters to generate said signal.

16. The inductor-capacitor phase interpolated voltage-controlled oscillator according to claim 15, wherein the fixed capacitance of said first inductor-capacitor tank is lower than the fixed capacitance of said third inductor-capacitor tank; and
wherein the fixed capacitance of said second inductor-capacitor tank is higher than the fixed capacitance of said third inductor-capacitor tank.

17. An inductor-capacitor phase interpolated voltage-controlled oscillator comprising:
a first phase-shifting means configured to generate a first signal by using a first inductor-capacitor tank having a fixed capacitance;
a second phase-shifting means configured to generate a second signal by using a second inductor-capacitor tank having a fixed capacitance; and
an interpolation means configured to generate a third signal by using a third inductor-capacitor tank having a fixed capacitance and selectively combining said third signal with said first and second signals to generate an output.

18. A method for implementing a voltage-controlled oscillator, comprising:
generating a first phase-shifted signal using a first inductor-capacitor tank having a first fixed resonant frequency;
generating a second phase-shifted signal using a second inductor-capacitor tank having a second fixed resonant frequency;
generating a third phase-shifted signal using a third inductor-capacitor tank with a third fixed resonant frequency; and
selectively combining said third phase-shifted signal with said first and second phase-shifted signals to generate a signal representing an output of said oscillator;

wherein said first, second and third fixed resonant frequencies are different; and wherein said first fixed resonant frequency is lower than said third fixed resonant frequency and said second fixed resonant frequency is higher than said third fixed resonant frequency.

19. A method for implementing a voltage-controlled oscillator, comprising:

generating a first transfer function using a first inductor-capacitor tank having a first fixed resonant frequency;

generating a second transfer function using a second inductor-capacitor tank having a second fixed resonant frequency;

generating a third transfer function using a third inductor-capacitor tank with a third fixed resonant frequency; and multiplying said third transfer function with said first transfer function to form a first output signal;

multiplying said third transfer function with said second transfer function to form a second output signal;

adjusting said first output signal and said second output signal; and adding said adjusted first and second output signals to generate an oscillator output.

* * * * *